(12) United States Patent
Cook

(10) Patent No.: US 10,901,005 B2
(45) Date of Patent: *Jan. 26, 2021

(54) LOW POWER BASED ROGOWSKI COIL

(71) Applicant: Veris Industries, LLC, Tualatin, OR (US)

(72) Inventor: Martin Cook, Tigard, OR (US)

(73) Assignee: Veris Industries, LLC, Tualatin, OR (US)

(*) Notice: Subject to any disclaimer, the term of this patent is extended or adjusted under 35 U.S.C. 154(b) by 294 days.

This patent is subject to a terminal disclaimer.

(21) Appl. No.: 15/178,927

(22) Filed: Jun. 10, 2016

(65) Prior Publication Data
US 2017/0059621 A1    Mar. 2, 2017

Related U.S. Application Data

(60) Provisional application No. 62/213,424, filed on Sep. 2, 2015.

(51) Int. Cl.
*G01R 15/18*    (2006.01)

(52) U.S. Cl.
CPC .................................. *G01R 15/181* (2013.01)

(58) Field of Classification Search
None
See application file for complete search history.

(56) References Cited

U.S. PATENT DOCUMENTS

| | | | | |
|---|---|---|---|---|
| 4,384,289 | A * | 5/1983 | Stillwell | G01K 1/024 324/126 |
| 4,709,339 | A * | 11/1987 | Fernandes | G01K 1/024 324/127 |
| 5,414,400 | A | 5/1995 | Gris et al. | |
| 5,852,395 | A * | 12/1998 | Bosco | G01R 15/181 336/174 |
| 6,313,623 | B1 | 11/2001 | Kojovic et al. | |
| 7,227,441 | B2 | 6/2007 | Skendzic et al. | |
| 7,227,442 | B2 | 6/2007 | Skendzic | |
| 7,538,541 | B2 | 5/2009 | Kojovic | |
| 7,564,233 | B2 | 7/2009 | Kojovic | |
| 7,902,812 | B2 | 3/2011 | Kojovic | |
| 7,986,968 | B2 | 7/2011 | Dobrowski et al. | |
| 8,330,449 | B2 | 12/2012 | Greenberg | |
| 8,872,611 | B2 | 10/2014 | Rouaud et al. | |
| 9,329,659 | B2 | 5/2016 | Cook | |
| 9,442,139 | B2 | 9/2016 | Hobelsberger et al. | |
| 9,448,258 | B2 | 9/2016 | Garabieta et al. | |
| 2004/0183522 | A1 | 9/2004 | Gunn | |
| 2008/0191705 | A1* | 8/2008 | Bellan | G01R 31/024 324/529 |
| 2009/0243590 | A1* | 10/2009 | West | G01R 19/04 324/117 R |
| 2011/0012587 | A1* | 1/2011 | Greenberg | G01R 1/22 324/114 |
| 2011/0043190 | A1 | 2/2011 | Farr | |
| 2011/0089933 | A1* | 4/2011 | Javora | G01R 15/142 324/127 |

(Continued)

FOREIGN PATENT DOCUMENTS

WO    2006108021 A2    10/2006
WO    2012022779 A1    2/2012

*Primary Examiner* — Paresh Patel
(74) *Attorney, Agent, or Firm* — Chernoff, Vilhauer, McClung & Stenzel, LLP

(57) ABSTRACT

A coil that includes an elongate conductor.

20 Claims, 21 Drawing Sheets

(56) References Cited

U.S. PATENT DOCUMENTS

| | | |
|---|---|---|
| 2016/0055963 A1 | 2/2016 | Lockstedt et al. |
| 2016/0091535 A1 | 3/2016 | Bannister et al. |
| 2017/0059620 A1 | 3/2017 | Cook |
| 2017/0059622 A1 | 3/2017 | Cook |
| 2017/0059623 A1 | 3/2017 | Cook |
| 2017/0059624 A1 | 3/2017 | Cook |
| 2017/0059625 A1 | 3/2017 | Cook |

* cited by examiner

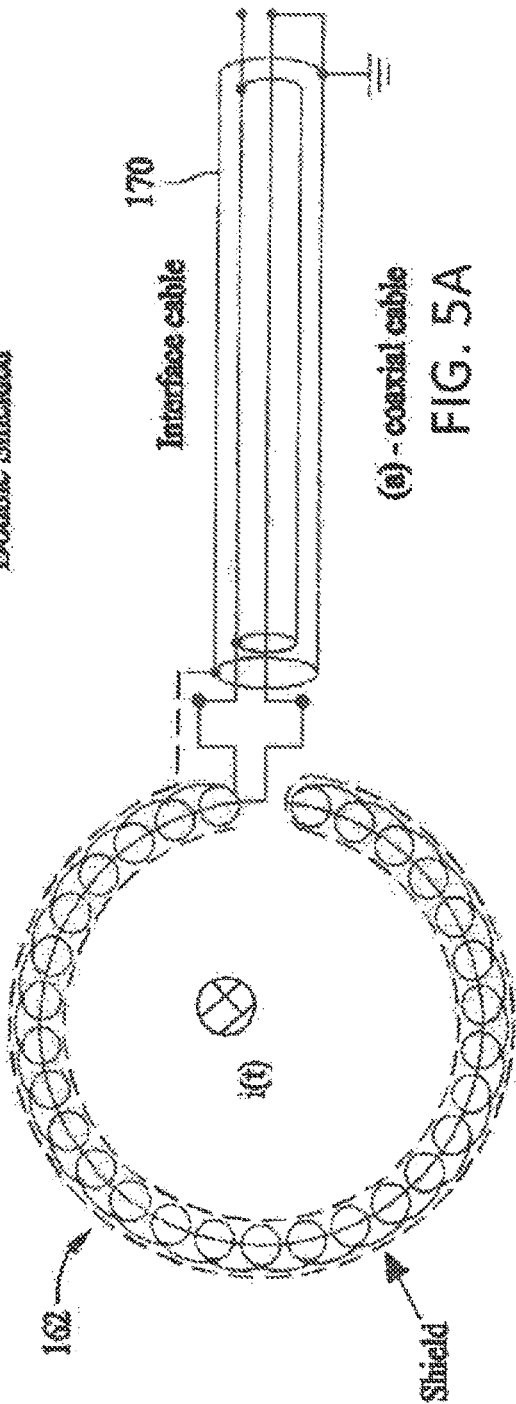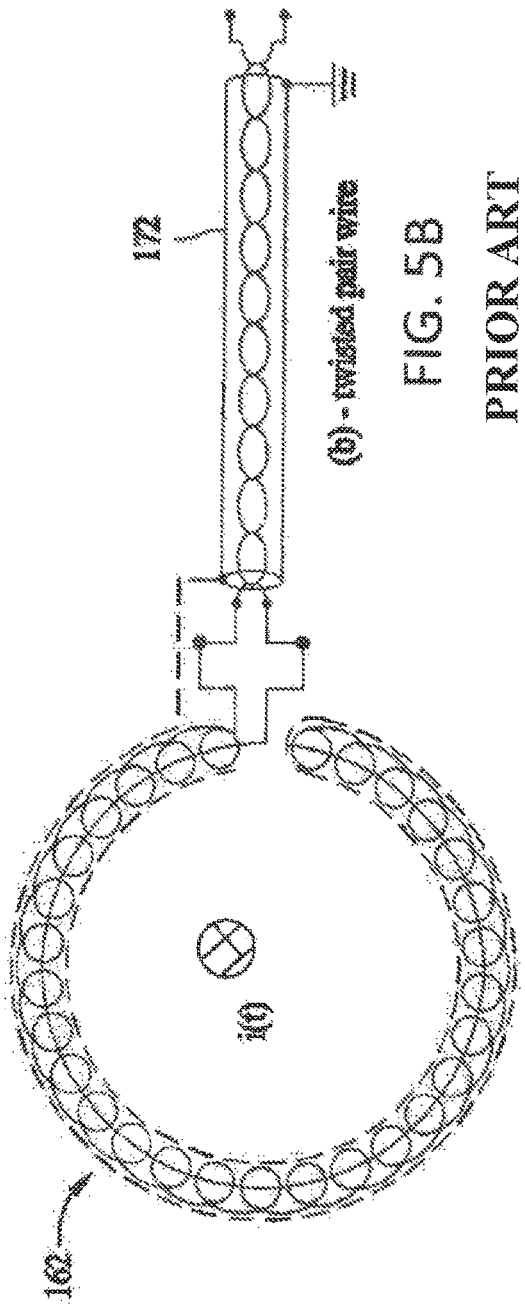
FIG. 5A PRIOR ART
FIG. 5B PRIOR ART

LOW POWER BASED ROGOWSKI COIL

CROSS-REFERENCE TO RELATED APPLICATIONS

This application claims the benefit of U.S. Provisional App. No. 62/213,424, filed Sep. 2, 2015.

TECHNICAL FIELD

The present disclosure relates generally to a Rogowski coil.

BACKGROUND OF THE INVENTION

A number of different types of measurement devices may be utilized to detect or monitor current signals. For example, measurement devices are typically integrated into utility meters in order to monitor the current on one or more phases of an electrical power signal. In conventional devices, current transformers, shunts, and Hall Effect transducers are traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 5A illustrates a further modified Rogowski coil and connection.

FIG. 5B illustrates a further modified Rogowski coil and connection.

DETAILED DESCRIPTION OF PREFERRED EMBODIMENT

Figure 1:
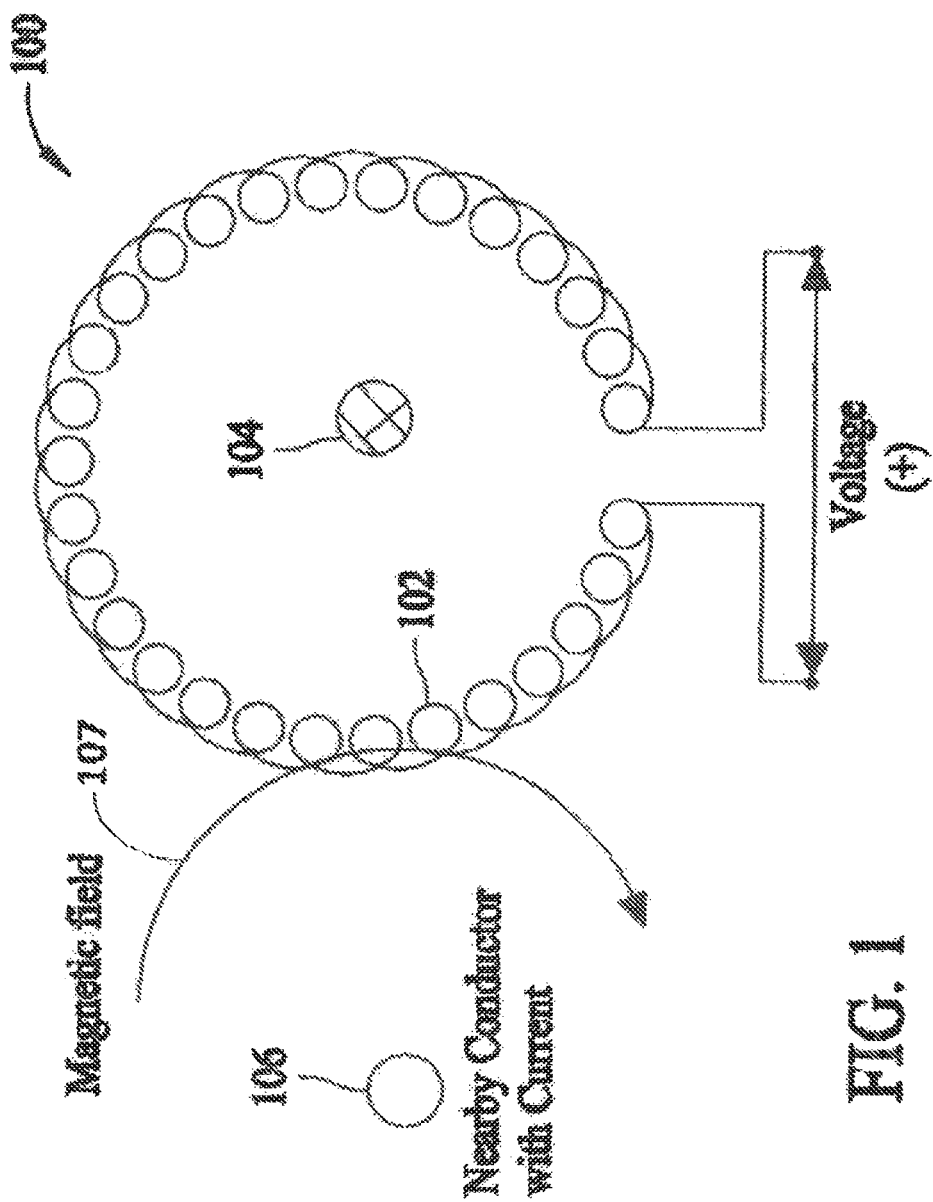
FIG. 1 illustrates a Rogowski coil, an internal conductor, and an external conductor.

Referring to FIG. 1, a Rogowski coil 100 is generally fabricated from a conductor 102, that may include a wire, that is coiled or wound on a substantially non-magnetic core, which may be, for example, air or a substantially non-magnetic material. The 102 coil may be placed around a conductor or conductors 104 whose current(s) is to be measured with the coil 102. A primary current flowing through the conductor 104 generates a magnetic field that, in turn, induces a voltage in the coil 102. A voltage output v(t) of the coil 102 is generally governed by the following Equation:

$$v(t) = -\mu_o \mu_r n S [dl\, i(t)/dl\, t] = -M[dl\, i(t)/dl\, t].$$

where $\mu_o$, is the magnetic permeability of free space, $\mu_r$ is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104. In a similar manner, the output of the coil may be a current signal i(t).

For an ideal Rogowski coil 102, M is independent of the location of the conductor 104 within the coil 102. The Rogowski coil output voltage v(t) is proportional to the rate of change of the measured current i(t) flowing in the conductor 104. The coil output voltage v(t) may be integrated to determine the current i(t) in the conductor 104.

Figure 2A:
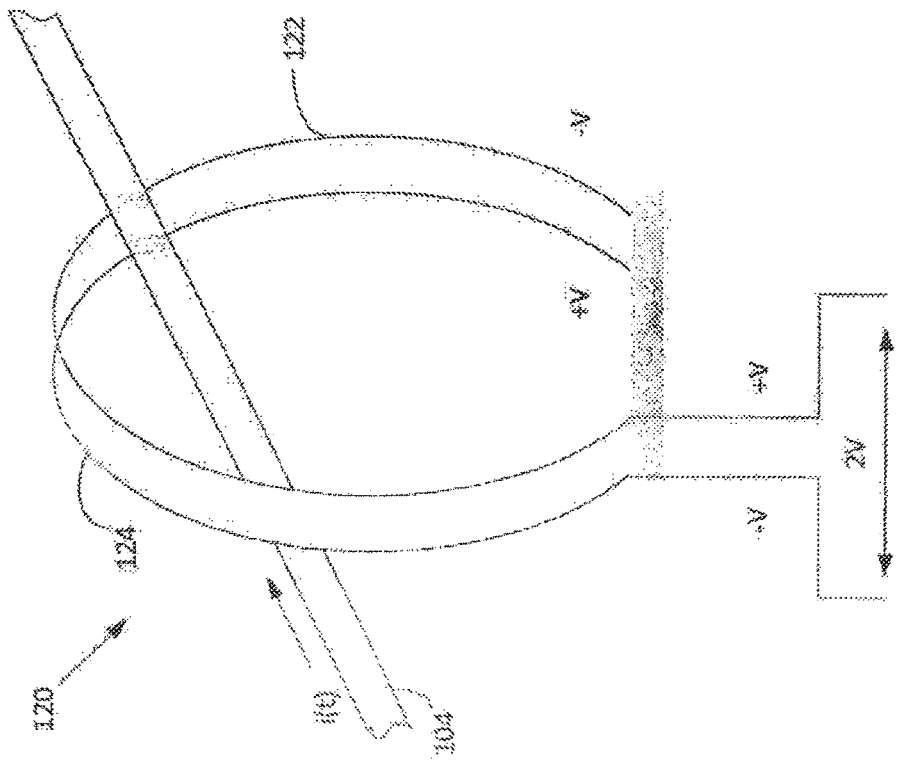
FIG. 2A illustrates a modified Rogowski coil.

Referring also to FIG. 2A, to reduce undesirable influence of a nearby conductor 106, which generates an electromagnetic field 107, a coil 120 may include first and second wire coils or loops 122, 124 wound in electrically opposite directions. The two coils 122, 124 effectively cancel substantially all electromagnetic fields coming from outside the coil 120. One or both loops 122, 124 may be configured from a wound wire on the core. If only one loop wire wound on a non-magnetic core is utilized, then the other loop may be returned through the center of the coil 120 to cancel undesirable effects of external magnetic fields.

Figure 2B:
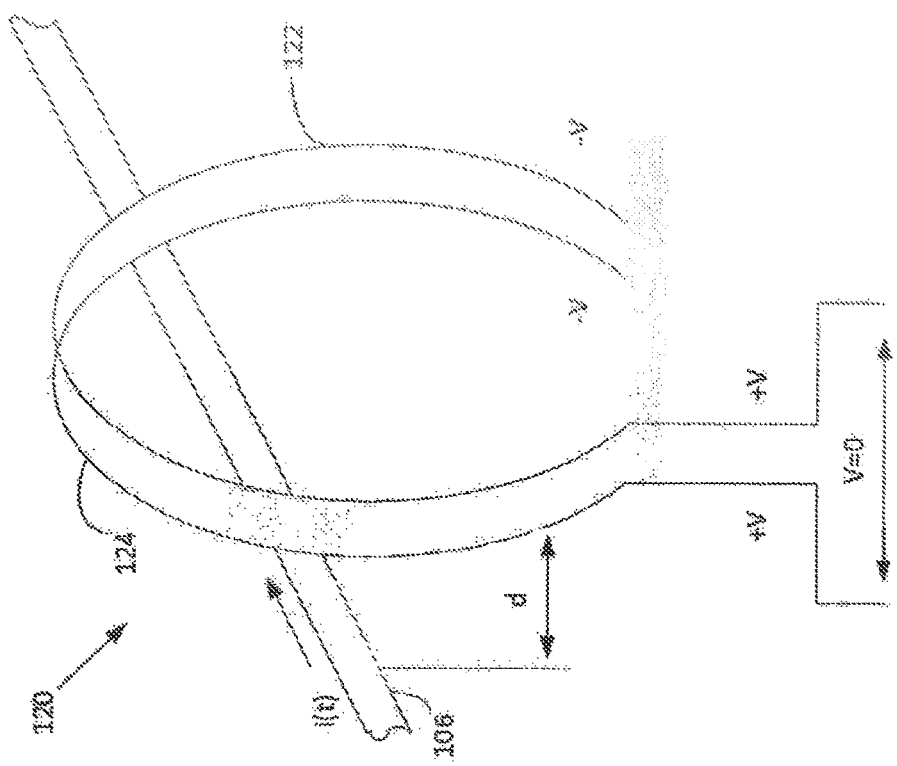
FIG. 2B illustrates a further modified Rogowski coil.

Referring also to FIG. 2B, both loops 122 and 124 may include wound wires, with the second winding 124 being wound in the opposite direction. In this configuration, the voltage induced in the coil 120 from the conductor passing through the coil will be doubled.

Figure 3:
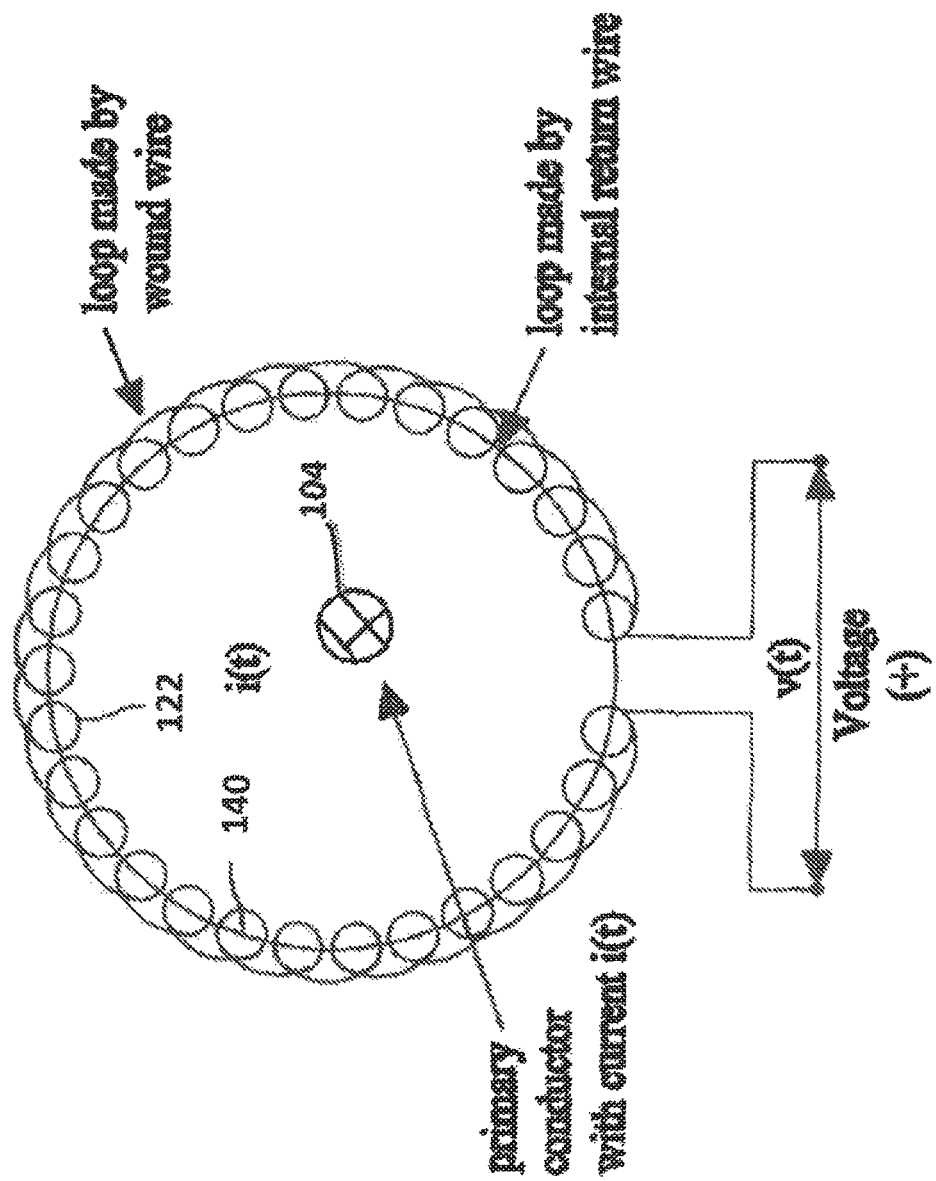
FIG. 3 illustrates a further modified Rogowski coil.

Referring to FIG. 3, a Rogowski coil may include a substantially flexible, nonmagnetic core 140 such as cores commonly used in known coaxial cables. Insulating jackets and shielding from such cables, may be stripped to obtain the cores, and after cutting the cable core to size, the coil 122 (and 124) may be wound over the core 140. Existing conductors extending through the center of the core 140 may serve as the return loop for reduction of external magnetic fields, as described above. In lieu of such flexible cores 140, coils may be fabricated from relatively rigid and straight rods that may be manufactured with a more uniform cross sectional area than the flexible cores. In lieu of such flexible cores 140, coils may be fabricated on dielectric material, such as a patterned circuit board.

The outputs of the coils tend to be susceptible to noise, signal distortion, and undesirable influences by surrounding conductors and equipment in the vicinity of the coils. To reduce such influences shielding may be included.

Figure 4A:
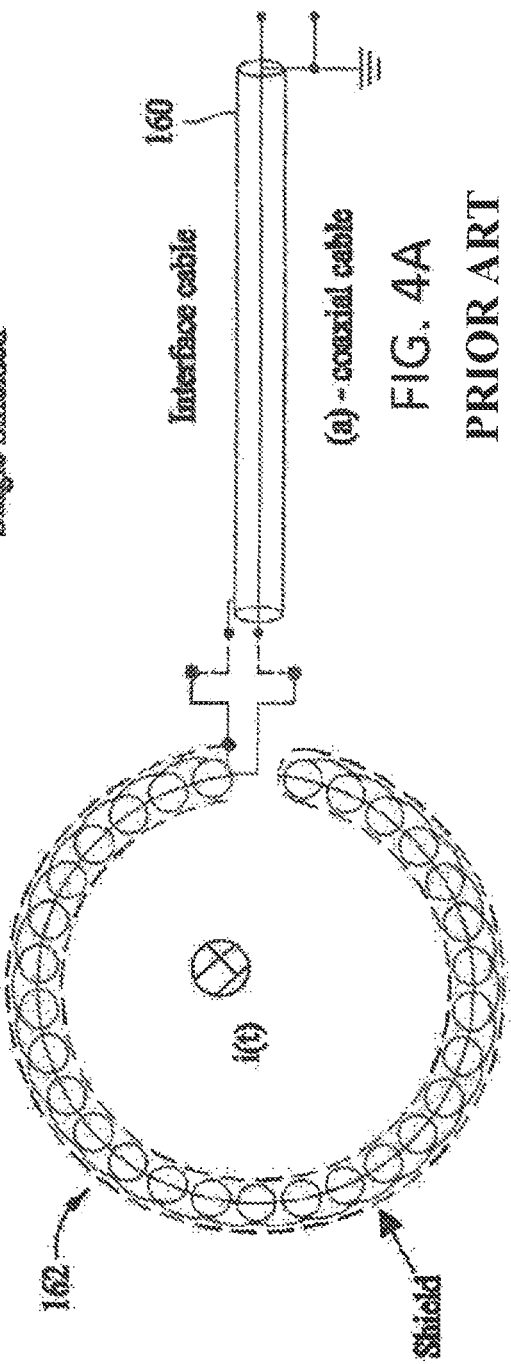
FIG. 4A illustrates a further modified Rogowski coil and connection.
Figure 4B:
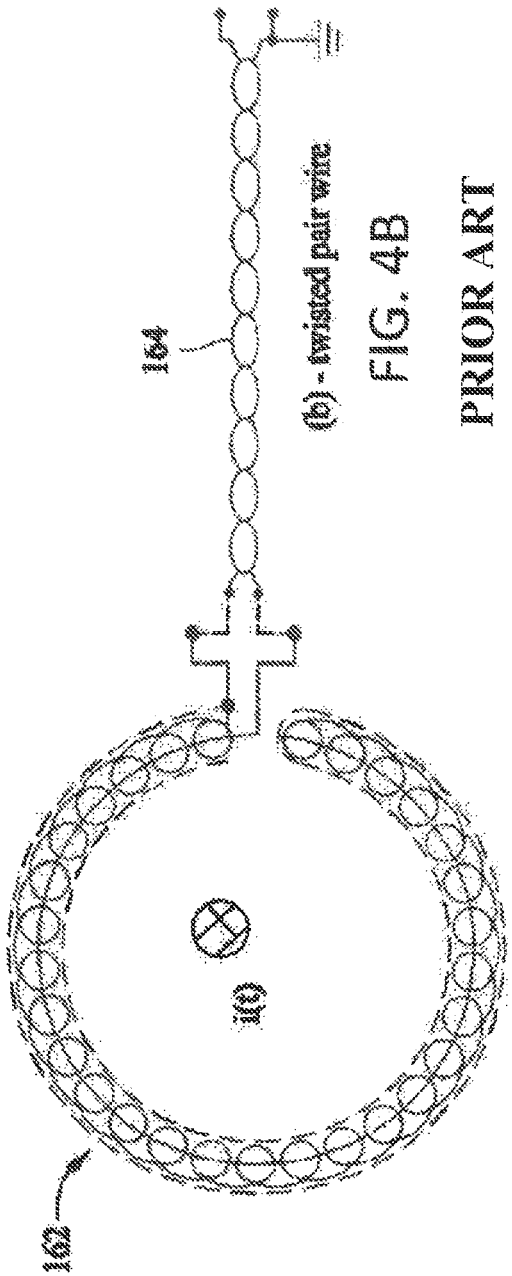
FIG. 4B illustrates a further modified Rogowski coil and connection.

Referring to FIG. 4A, the Rogowski coil and its secondary leads may include a shielded coaxial cable 160 that is connected to a coil 162. Referring to FIG. 4B, a twisted pair wire 164 is connected to the coil 162. The twisted wires carry equal but opposite signals and are less susceptible to noise issues and cross talk issues from adjacent signal conductors. The shielded cable 160 and the twisted pair wire 164 provide protection against noise and electromagnetic influences in the environment of the coils 162.

FIGS. 5A and 5B illustrate another approach for improving the integrity of the coil output signals. FIG. 5A illustrates a double shielded cable 170 having concentric layers of insulation around the signal conductors in the cable. FIG. 5B illustrates a shielded twisted pair wire 172. The double shielding shown in FIGS. 5A and 5B are more effective than the single shielding features shown in FIGS. 4A and 4B.

Figure 6:
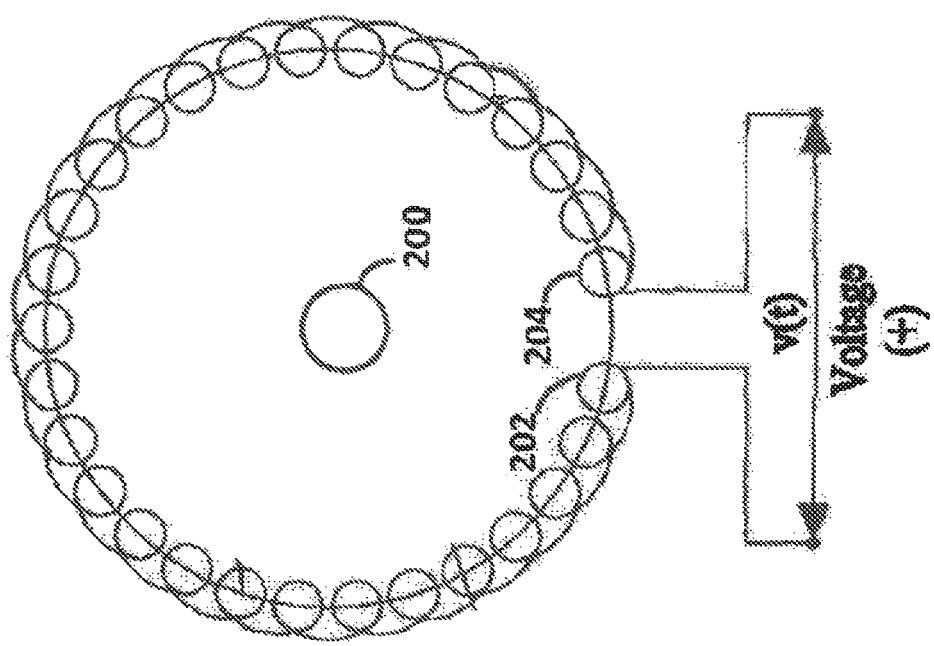
FIG. 6 illustrates a further modified Rogowski coil and connection.
Figure 7:
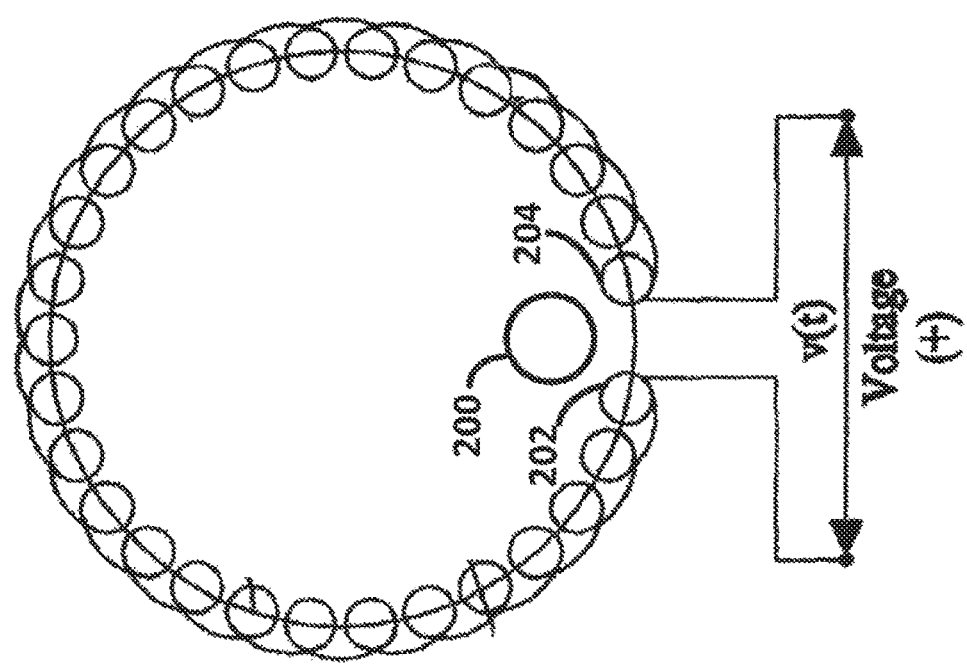
FIG. 7 illustrates a further modified Rogowski coil and connection.
Figure 8:
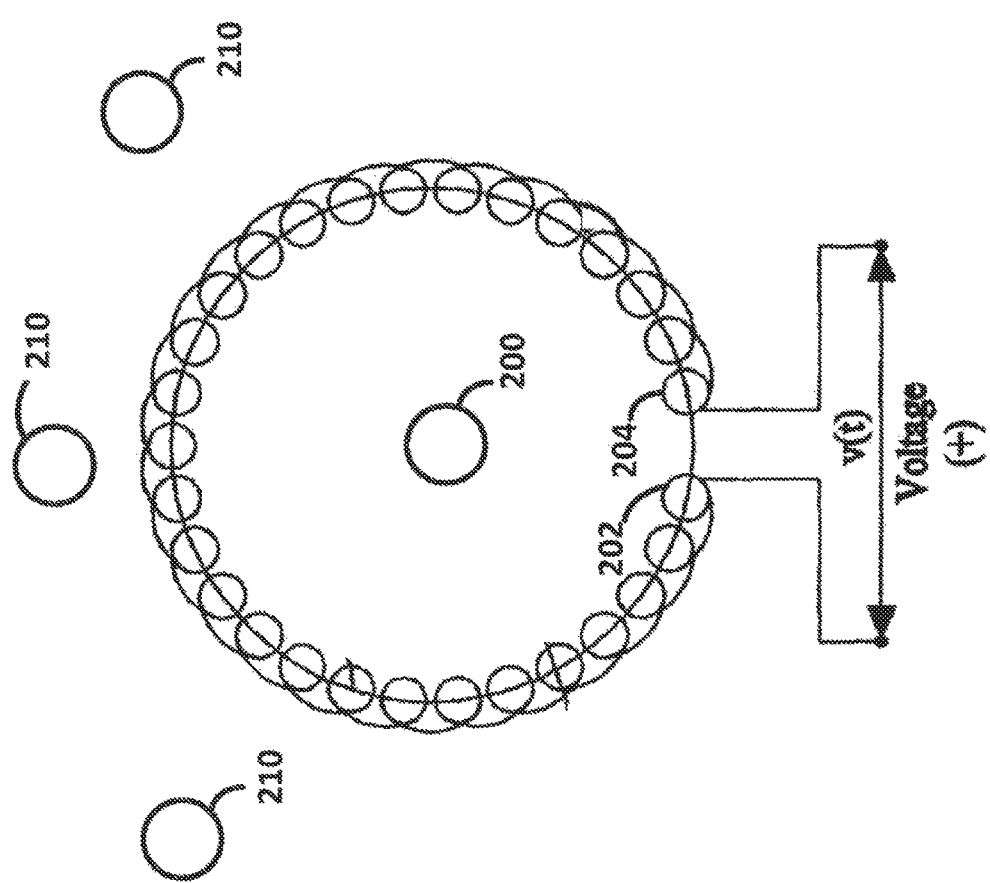
FIG. 8 illustrates a further modified Rogowski coil and connection.

As described, the Rogowski coil may be flexible in shape in order to readily open and close it on the conductor to be measured. This flexibility is especially useful when installing the Rogowski coil around conductors with limited or irregular space constraints. However, the closure system between the ends of the loops from a mechanical perspective (e.g., precision of the positioning of the two ends of the loop) and from an electrical perspective (e.g., the electrical discontinuity of the electrical fields) results in a non-uniformity of the measuring of the fields within the loop. Referring to FIG. 6, a first measurement may be made based upon a first conductor 200 centered within the loop. The measurement will be incorrect due to the non-uniform field created by the closure system between the ends 202, 204 of the loop. Referring to FIG. 7, a second measurement may be made based upon the first conductor 200 located proximate the closure system within the loop. The measurement will be incorrect due to the non-uniform fields created by the closure system within the loop. Referring to FIG. 8, the measurement tends to be incorrect, even with external fielding canceling techniques, due to the non-uniform field created by one or more external conductors 210 in addition to the non-uniform field created by the closure system between the ends 202, 204 of the loop.

Figure 9:
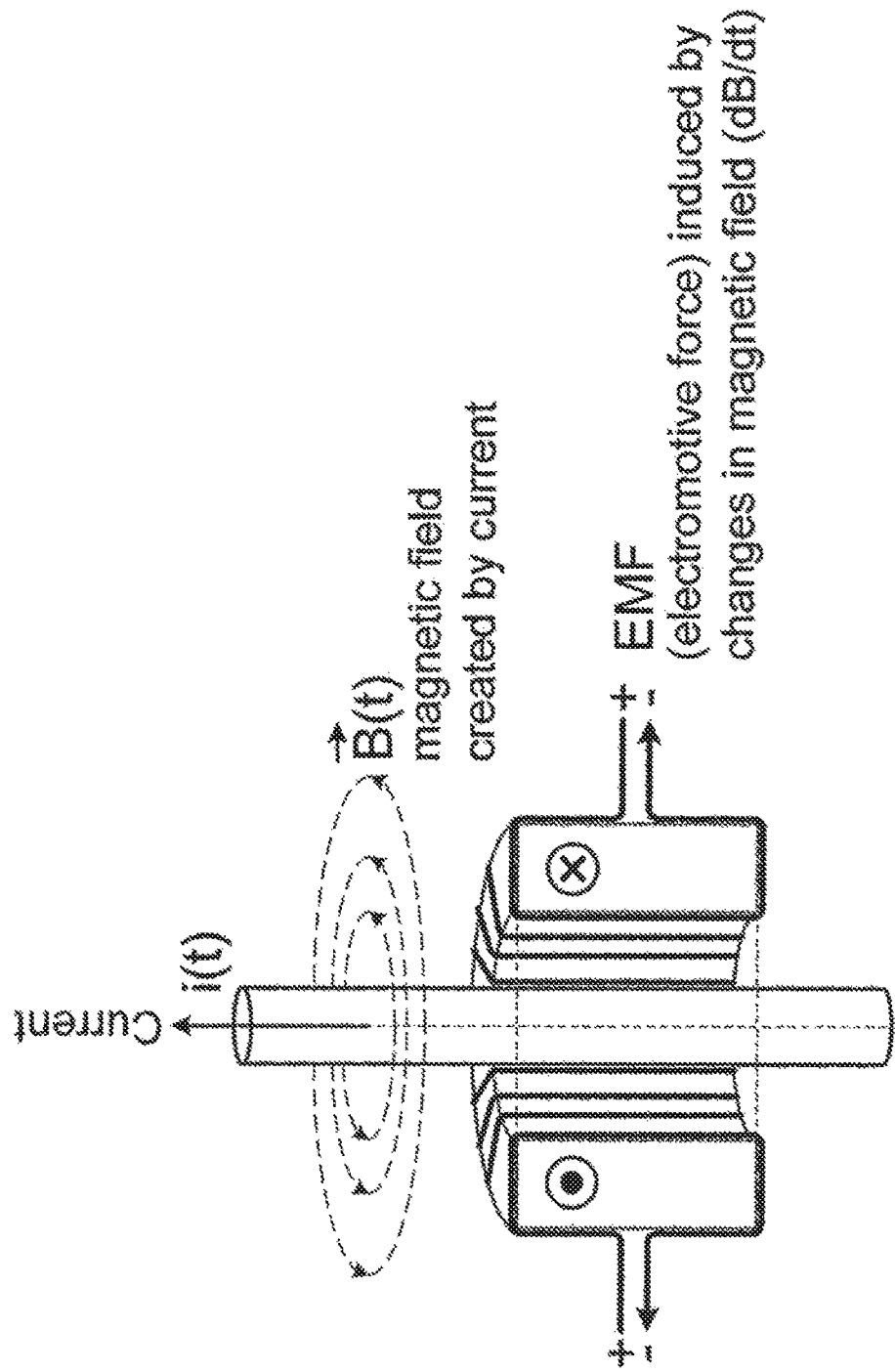
FIG. 9 illustrates a Rogowski coil and its electromotive force.

Referring to FIG. 9, an exemplary diagram of a Rogowski coil arranged around a long straight wire perpendicular to the magnetic field is shown, illustrating the magnetic field (B field) generated by the current i(t). Moreover, as previously described, the EMF may be generally determined by EMF=−Md(i)/dt.

Figure 10:
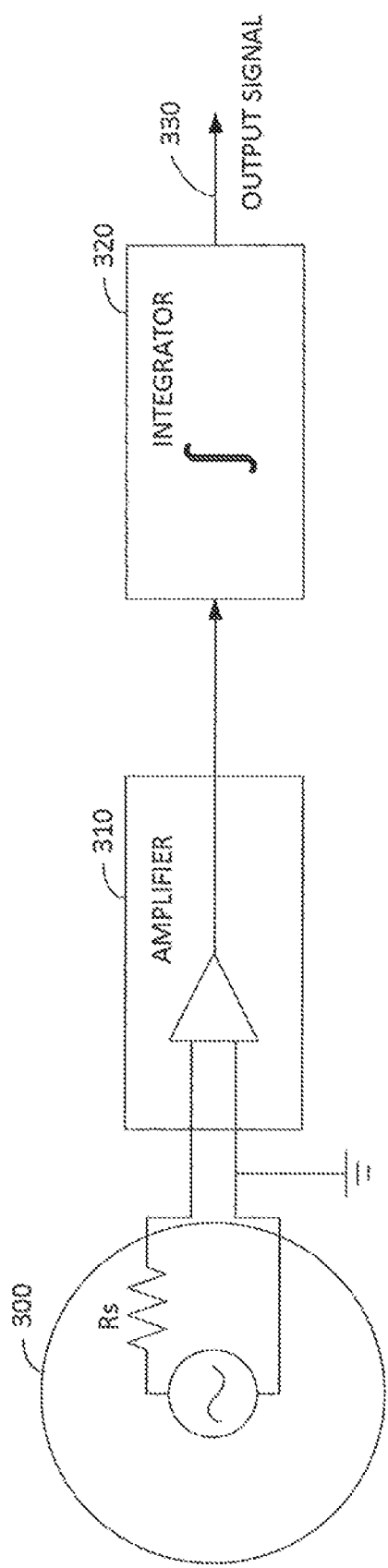
FIG. 10 illustrates a Rogowski coil, together with an amplifier and an integrator.

Referring to FIG. 10, since the output signal from the Rogowski coil 300 tends to be relatively small the signal is preferably amplified using a suitable amplification circuit 310. The output of the amplification circuit 310 is then preferably integrated using an integrator 320 to provide an output signal 330 indicative of the current. The integrator 320 preferably includes compensation for a 90 degree phase shaft and a 20 dB/decade gain generated by the Rogowski coil. It is to be understood that the amplification and/or integration may be performed using firmware using any computing process.

Figure 11:
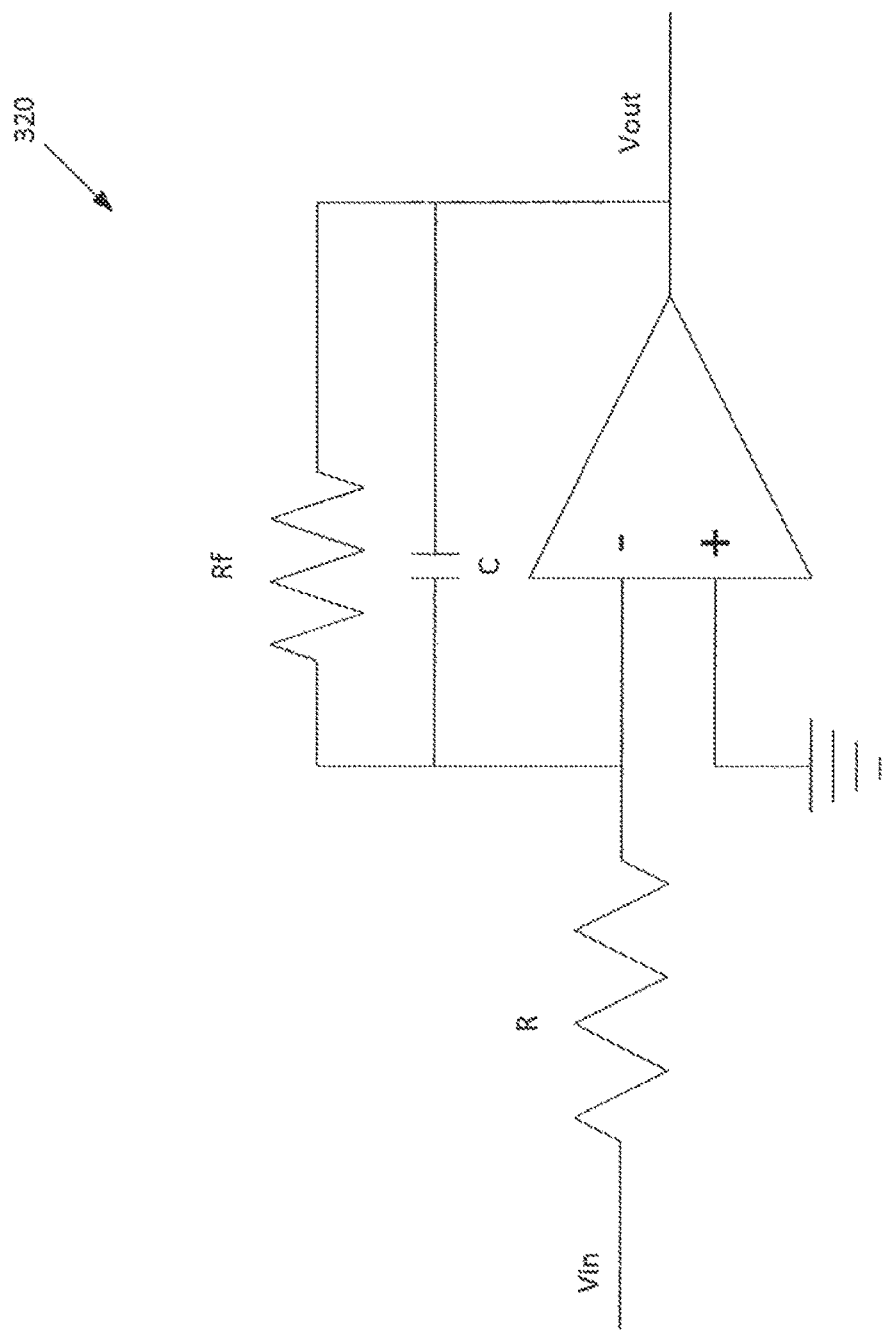
FIG. 11 illustrates an integrator.

Referring to FIG. 11, an exemplary integrator 320 may include an inverting operational amplifier and a resistor-capacitor circuit.

Figure 12:
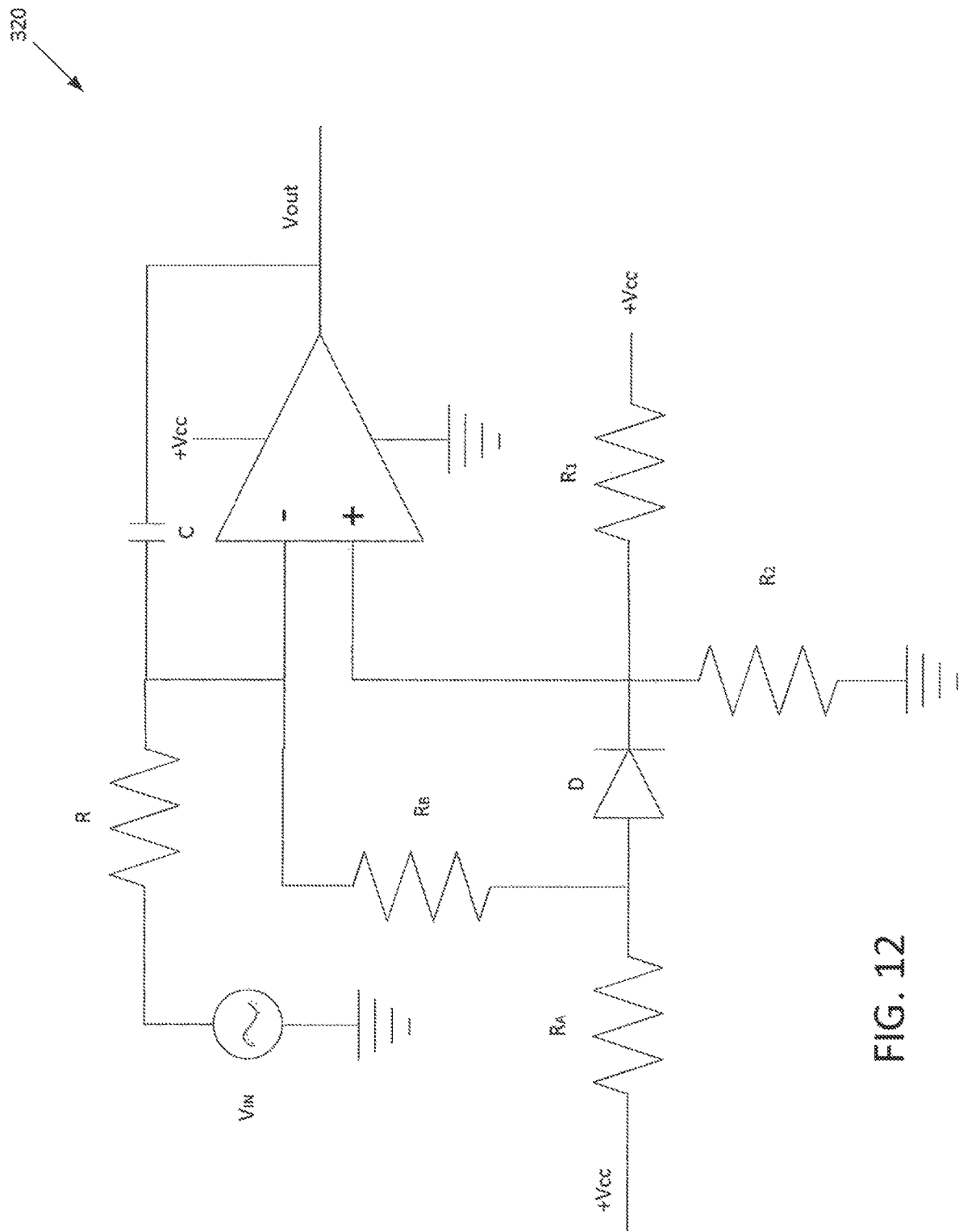
FIG. 12 illustrates another integrator.

Referring to FIG. 12, an exemplary integrator 320 may include an operational amplifier with input current compensation. The resistors R1 and R2 are relatively small, and the resistor $R_B$ is relatively large.

Figure 13:
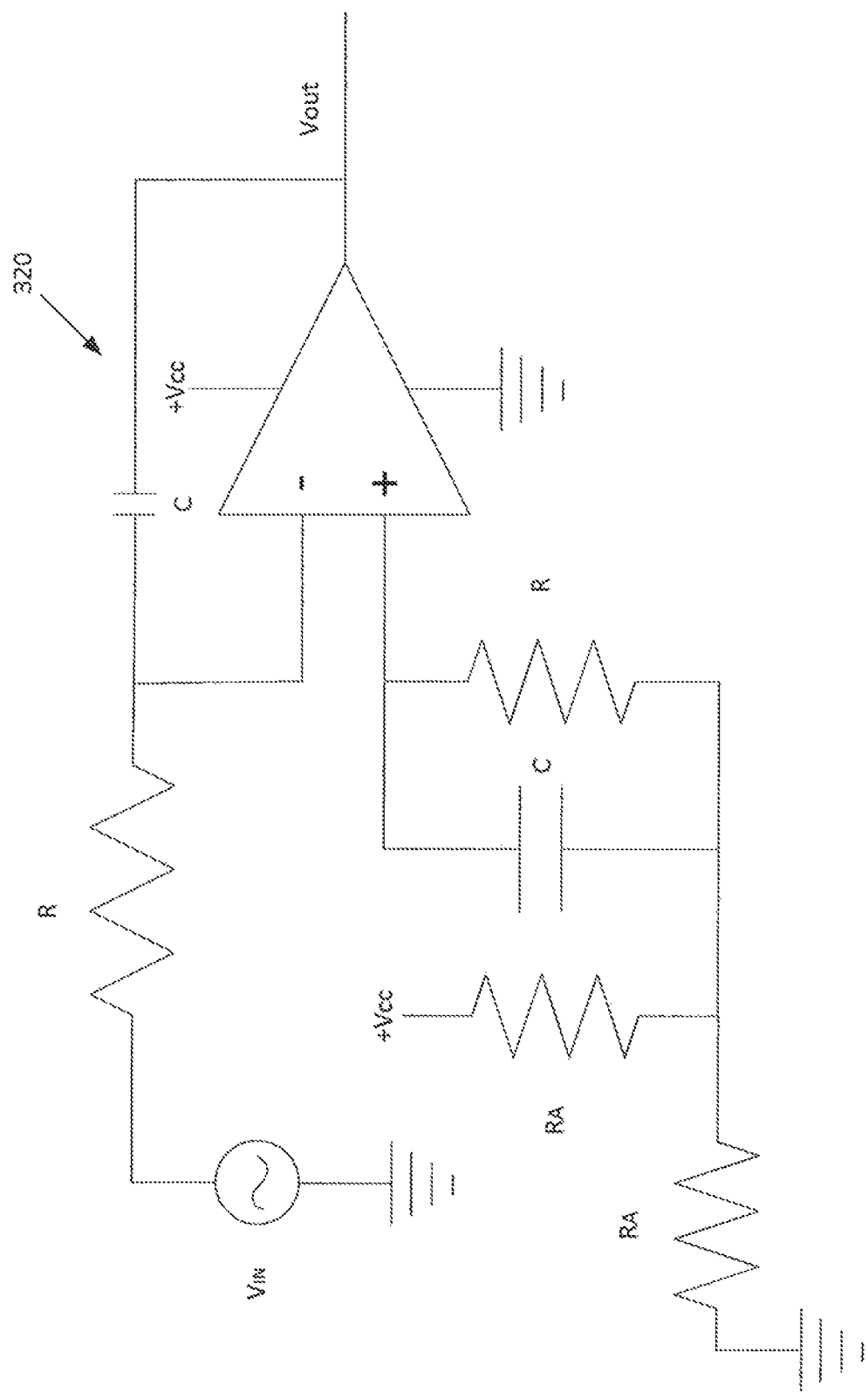
FIG. 13 illustrates another integrator.

Referring to FIG. 13, an exemplary integrator 320 may include an operational amplifier with drift compensation. The positive input current drops the same voltage across the parallel RC combination as the negative input current drops across its series RC combination.

Figure 14A:
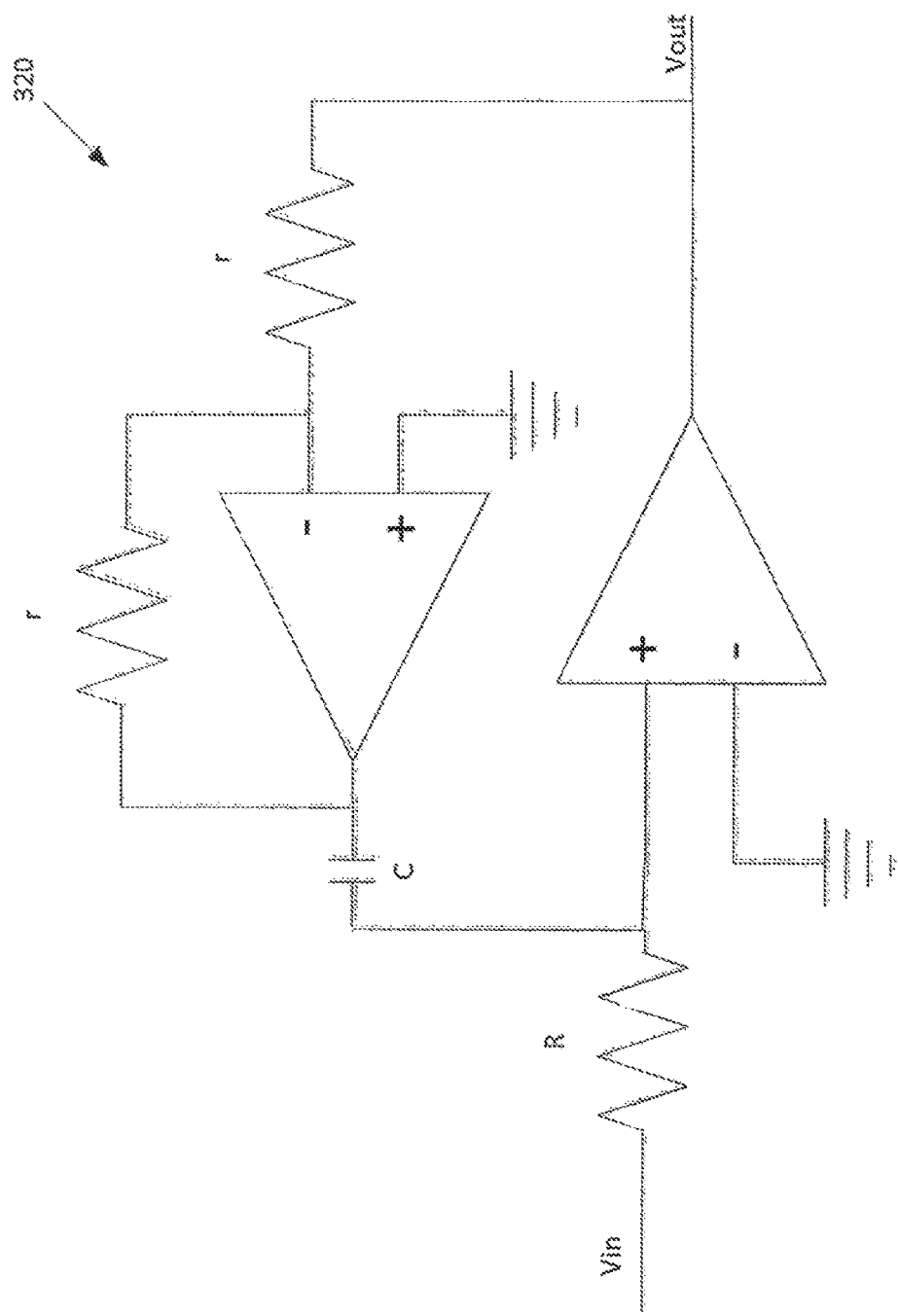
FIGS. 14A-B illustrate other integrators.
Figure 14B:
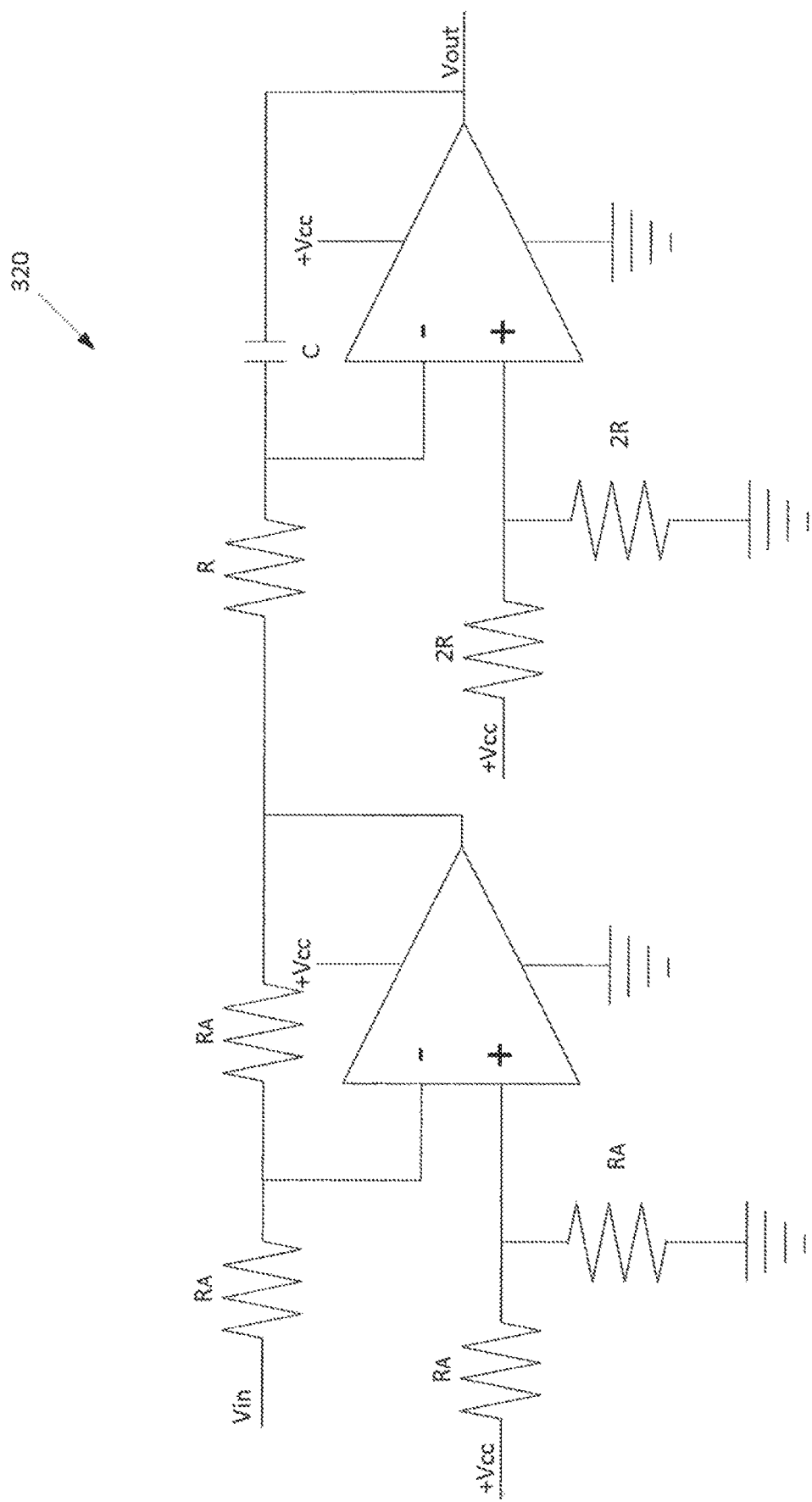

Referring to FIGS. 14A-B, an exemplary integrator 320 may include two operational amplifiers with a non-inverting integrator and an inverting buffer.

Figure 15:
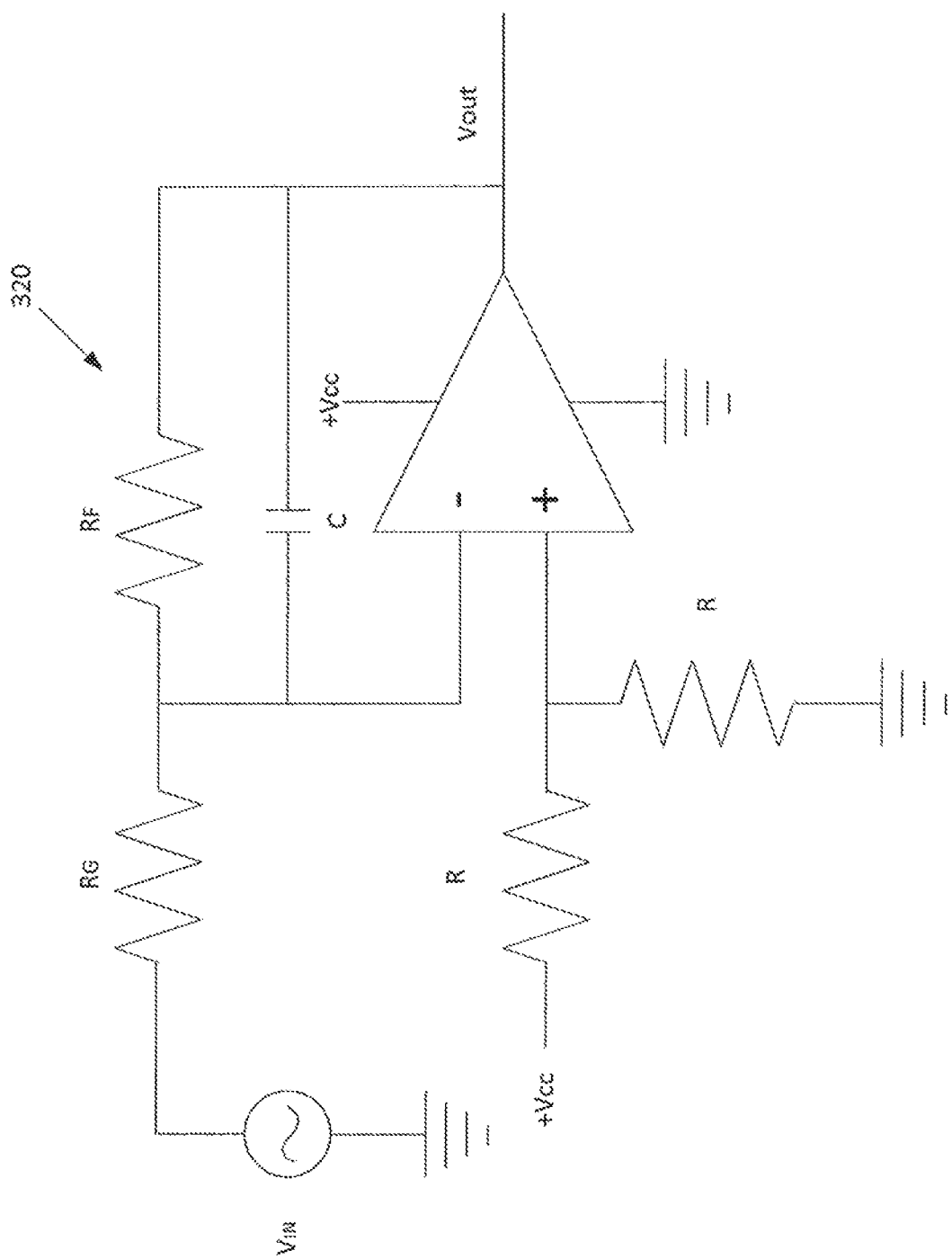
FIG. 15 illustrates another integrator.

Referring to FIG. 15, an exemplary integrator 320 may include an operational amplifier with an inverting integrator with a resistive reset.

Figure 16:
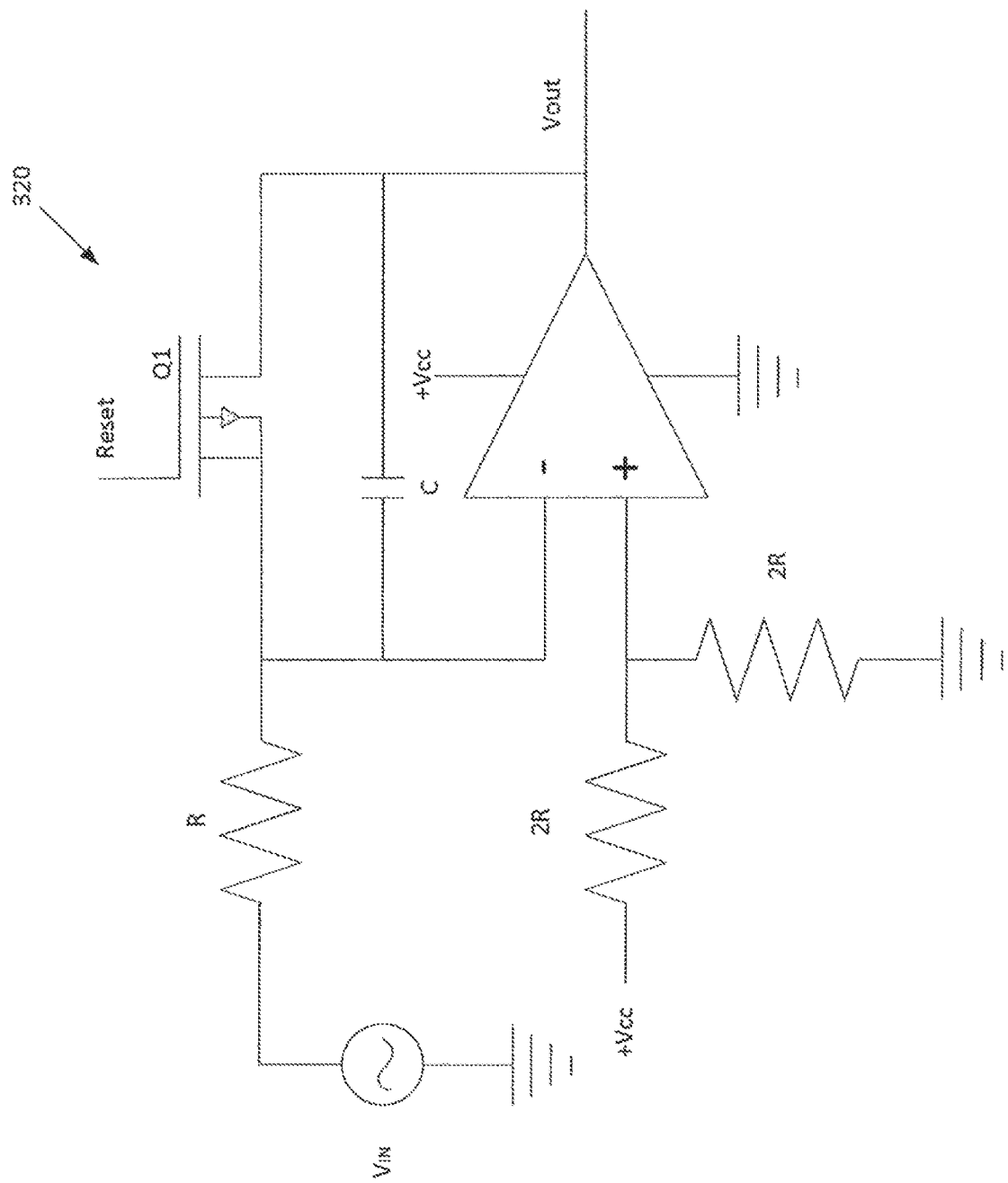
FIG. 16 illustrates another integrator.

Referring to FIG. 16, an exemplary integrator 320 may include an operational amplifier with an inverting integrator with an electronic reset.

It is to be understood that other active circuits may likewise be used, as desired. It is to be understood that a digital integrator may be used, if desired. It is to be understood that passive circuits may likewise be used, as desired.

In some environments, especially in environments that are sensitive to extraneous power conductors provided to and from the Rogowski coil or otherwise it is problematic to route wires to and from the Rogowski coil, it is desirable to obtain the signals from the Rogowski coil in a manner that avoids the requirement of including additional power conductors.

Figure 17:
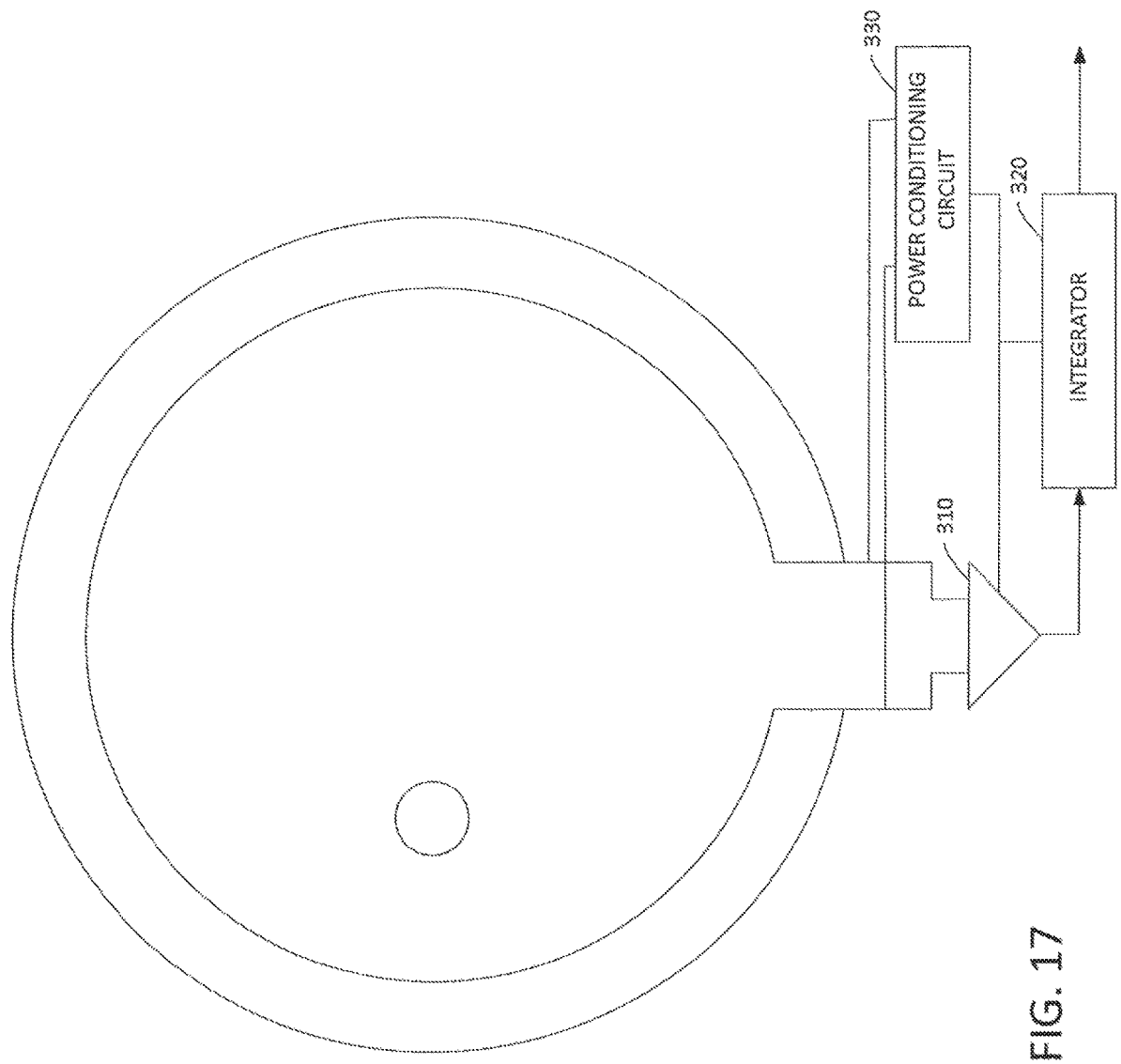
FIG. 17 illustrates a Rogowski coil with a power conditioning circuit.

Referring to FIG. 17, one technique to interconnect the Rogowski coil with other circuitry is to include one or more amplifiers 310 and/or an integrators 320 proximate the terminal portion of the conductors of the Rogowski coil. In the case that the power provided from the Rogowski coil is sufficient to power the amplifier 310 and/or integrator 320, a portion of the power generated by the Rogowski coil may be provided to a power conditioning circuit 330 which in turn is used to power the amplifier 310 and/or integrator 320. The power conditioning circuit 330 may also include a battery or other charge storage structure. Typically, the power available from the coil windings of the Rogowski coil is insufficient to power the amplifier and/or integrator, and in such cases additional structures may be included to provide sufficient power for the amplifier and/or integrator.

Figure 18:
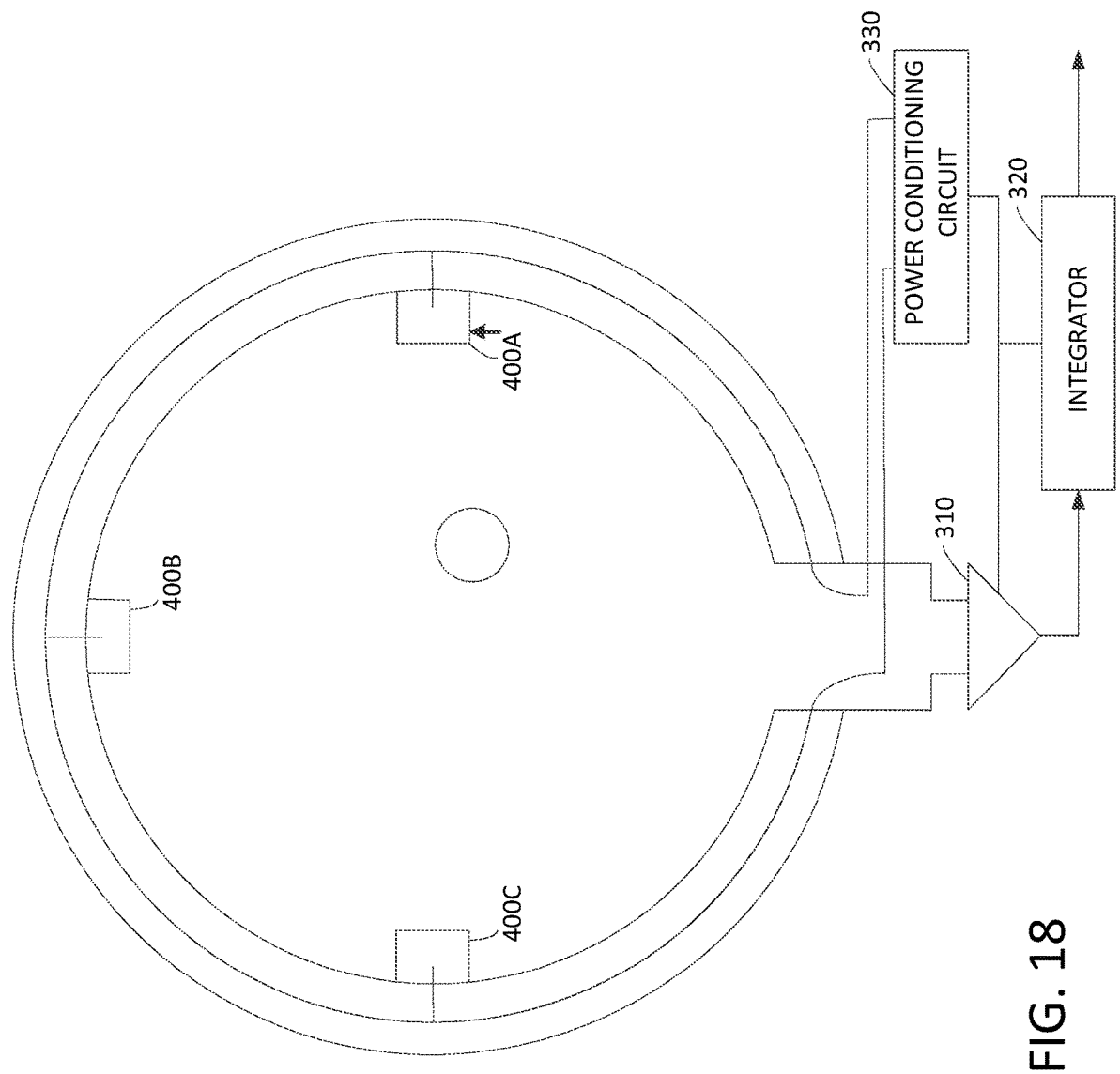
FIG. 18 illustrates another Rogowski coil with a power conditioning circuit.

Referring to FIG. 18, a modified Rogowski coil includes one or more energy harvesting circuits 410A, 410B, 410C supported by the Rogowski coil. The harvesting circuits may also be generally referred to as power harvesting and/or energy scavenging circuits. The harvesting circuits may use radio frequency, thermoelectric, electric, magnetic, solar, piezo electric (e.g., vibrations), etc., energy sources that are proximate the Rogowski coil to harvest energy which is converted to electricity and stored in a durable storage cell, such as a capacitor, or micro-energy cell which may be in a form of lithium solid-state battery. Preferably, the harvesting circuits use the magnetic energy of the conductor. The harvesting circuit includes circuitry to manage the power. The power obtained and stored by one or more harvesting circuits may be provided to the power conditioning circuit 330 which in turn is provided to the amplifier 310 and/or integrator 320 so that the output signal from the Rogowski coil may be more readily determined. In this manner, power from an external source does not need to be routed to the Rogowski coil to supply power to the amplifier 310 and/or integrator 320.

Figure 19:
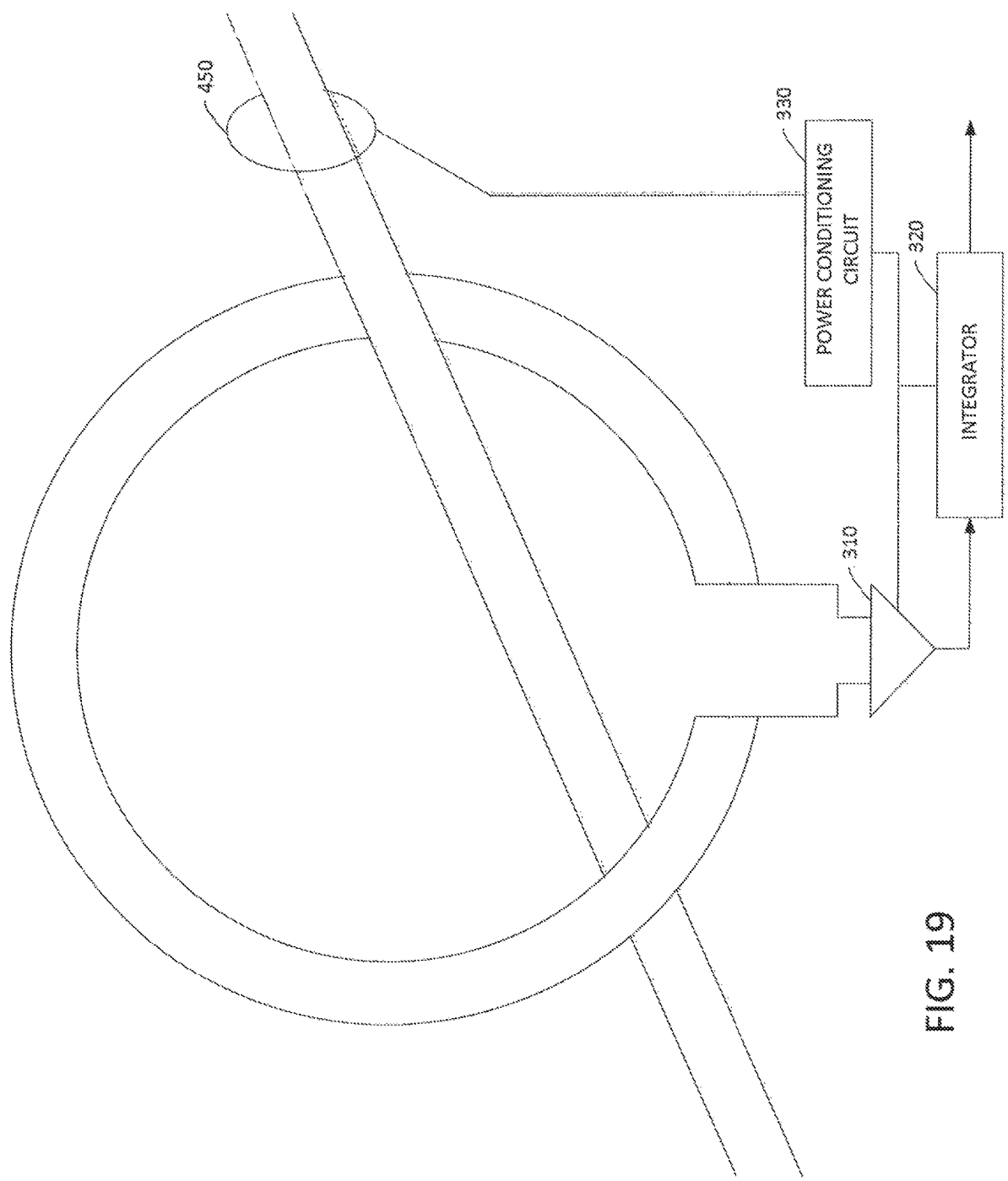
FIG. 19 illustrates another Rogowski coil with a power conditioning circuit.

Referring to FIG. 19, a modified Rogowski coil could include a separate substantially magnetically permeable core based coil 450 (or other type of coil or sensing device). For example, the sensing device may be a voltage tap to a wire.

For example, the coil 450 could obtain power from another conductor. The coil 450 is interconnected around the wire, preferably the same wire provided to the load which is being sensed by the Rogowski coil. The changing magnetic field in the wire is sensed by the coil 450 which provides sufficient power to the power conditioning circuit 330 which in turn is provided to the amplifier 310 and/or integrator 320 to modify the output signal of the Rogowski coil. In this manner, an external power source is not required for the Rogowski coil.

Figure 20:
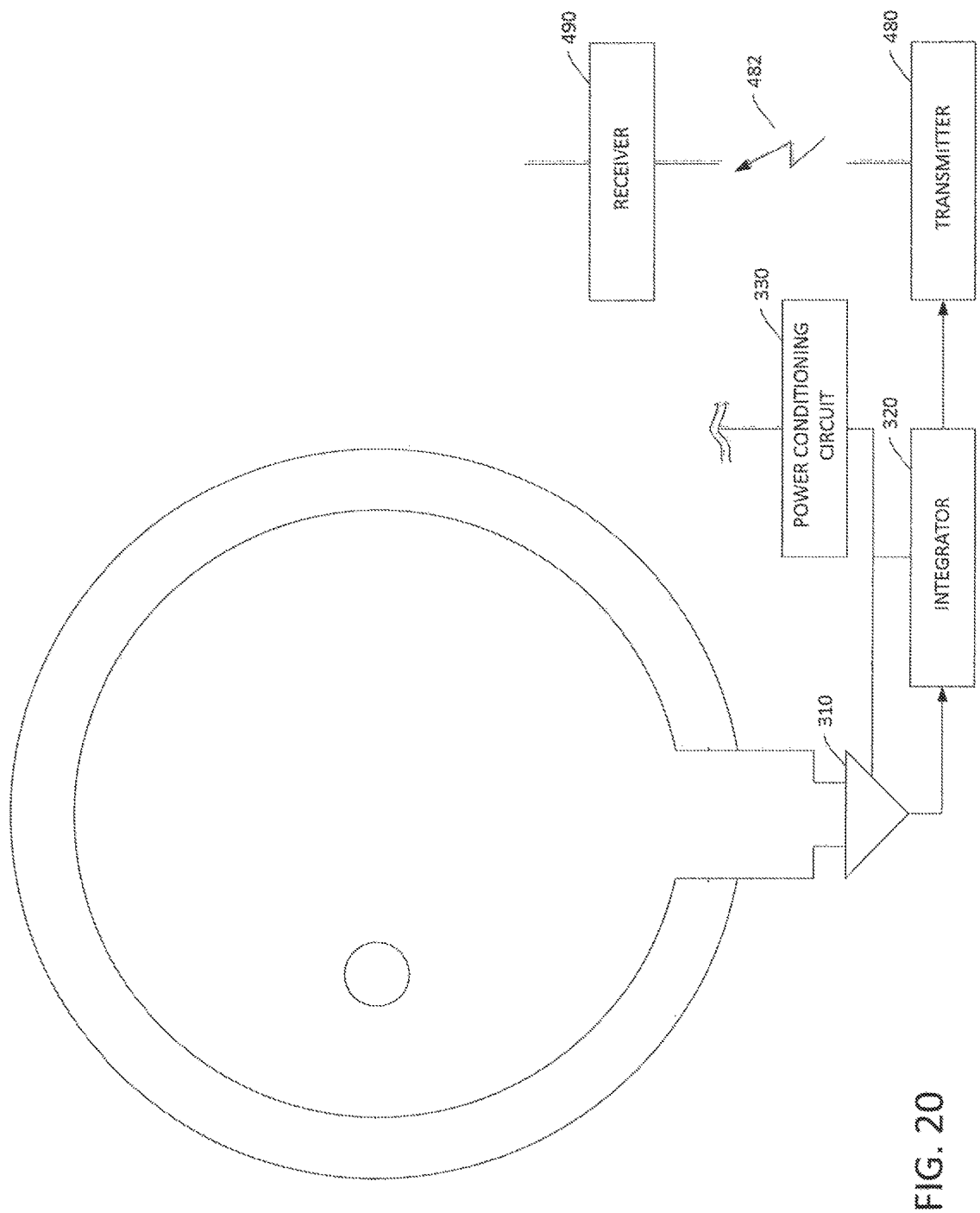
FIG. 20 illustrates another Rogowski coil with a power conditioning circuit.

Referring to FIG. 20, a modified Rogowski coil may include a transmitter 480 that receives the output from the amplifier 310 and/or integrator 320. The output from the amplifier 310 and/or integrator 320 may be provided to a transmitter 480 which transmits a wireless signal 482. The power for the transmitter 480 may be provided from the Rogowski coil and/or the coil 450. The power conditioning circuit 330 may be included, if desired. In this manner, the amplifier 310 and/or integrator 320 together with the transmitter 480 may be provided from power available locally without the need for an external power source. A wireless receiver 490 may be remotely located from the transmitter 480 that receives the transmitted signals 482. The received wireless signals may be provided to a power meter or other electrical monitoring device.

During the initial setup of the Rogowski coil and the electronics associated therewith, the amplifier and/or integrator and/or transmitter may be calibrated. For example, the amplifier may be calibrated to adjust its input signal to an appropriate range, may be calibrated to provide a selectable gain at its output thereof, among other characteristics of the amplifier. For example, the integrator may be calibrated to adjust its input signal to an appropriate range, may be calibrated to provide an integration rate, may be calibrated to provide a selected output, among other characteristics of the amplifier. For example, the transmitter may be calibrated to select a rate at which the signals are transmitted, select the manner in which the signals are transmitted, select the encoding of the signals in which the signals are transmitted, select the power used for the transmission of the signals, select an identification code to identify the particular Rogowski coil, among other characteristics of the transmitter.

In order to more readily modify such characteristics associated with the Rogowski coil, the transmitter 480 may also include a receiver that receives a signal that includes data for calibrating the electronics, including the identification code, associated with the Rogowski coil. In this manner, the Rogowski coil and its associated electronics may be configured using a remote connection.

In another embodiment a conductive based core, such as a ferrite core, may be used as the current transformer. In addition, the current transformer may be a solid core or a split core current transformer.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A coil for sensing a changing current comprising:
   an elongate substantially flexible core material, the elongate substantially flexible core material having a first end portion, a second end portion, a first middle portion between the first end portion and the second end portion, the second end portion at an opposite end of the elongate substantially flexible core material than the first end portion;
   a conductive sensing element supported by the first middle portion of the substantially flexible core material that senses electromagnetic fields;
   a coupler that interconnects the first end portion and the second end portion of the substantially flexible core material;
   more than one energy harvesting element supported by the elongate substantially flexible core material that is not connected to the conductive sensing element which generate more than one corresponding energy harvesting electrical signal;
   a sensing module that receives a signal from the conductive sensing element and estimates a signal representative of a changing energy of a conductor at least partially encircled within the elongate substantially flexible core material; and
   an energy sensing element electrically coupled to the conductor, where the energy sensing element is dissociated from the coil;
   wherein the sensing module receives operational power from the energy sensing element and the more than one energy harvesting element in response to the energy sensing element and the more than one energy harvesting element sensing an electromagnetic field.

2. The coil of claim 1 wherein the elongate substantially flexible core material is substantially round in cross section.

3. The coil of claim 2 wherein the conductive sensing element includes a conductive wire wrapped around the substantially flexible core material.

4. The coil of claim 1 wherein the sensing module includes an amplification circuit for the signal from the conductive sensing element.

5. The coil of claim 4 wherein the sensing module includes an integration circuit for the signal from the conductive sensing element.

6. The coil of claim 1 wherein the sensing module receives operational power from the conductive sensing element.

7. The coil of claim 1 wherein the sensing module receives operational power from the more than one energy harvesting elements supported by the elongate substantially flexible core material.

8. The coil of claim 1 wherein the energy sensing element includes a toroidal core.

9. The coil of claim 1 wherein an output of the sensing module is wirelessly transmitted by a transmitter.

10. The coil of claim 9 wherein the transmitter receives operational power from at least one of the conductive sensing element, the more than one energy harvesting elements supported by the elongate substantially non-conductive core, and an energy sensing element suitable to be electrically connected to the conductor that is not connected to the conductive sensing element, where the energy sensing element is dissociated from the coil.

11. The coil of claim 10 wherein the transmitter receives operational power from the conductive sensing element.

12. The coil of claim 10 wherein the transmitter receives operational power from the energy harvesting element supported by the elongate substantially flexible core material.

13. The coil of claim 10 wherein the transmitter receives power for its operation from the energy sensing element suitable to be electrically connected to the conductor.

14. The coil of claim 10 wherein the transmitter also receives configuration data that is used to modify at least one of the transmitter and the sensing module.

15. The coil of claim 14 wherein the configuration data is used to said modify the transmitter.

16. The coil of claim 14 wherein the configuration data is used to modify the sensing module.

17. The coil of claim 1 wherein the coil does not receive power from a wire connected to an external power source.

18. The coil of claim 1 wherein the more than one energy harvesting element harvests energy from one of Radio Frequency (RF), thermoelectric, solar, and piezo electric sources.

19. A method for sensing a changing current in a coil comprising:
- sensing electromagnetic fields with an elongate substantially flexible core material of the coil, the elongate substantially flexible core material having a first end portion, a second end portion, and a first middle portion between the first end portion and the second end portion, the second end portion at an opposite end of the elongate substantially flexible core material than the first end portion, and the first end portion and the second end portion interconnected with a coupler;
- generating more than one energy harvesting electrical signal from a corresponding more than one energy harvesting element supported by the elongate substantially flexible core material that is not connected to a conductive sensing element of the coil, the conductive sensing element supported by the first middle portion of the substantially flexible core material;
- receiving a signal from the conductive sensing element at a sensing module of the coil, and estimating a signal representative of a changing energy of a conductor at least partially encircled within the elongate substantially flexible core material at the sensing module; and
- wherein the sensing module receives operational power from an energy sensing element and the more than one energy harvesting element in response to the energy sensing element and the more than one energy harvesting element sensing an electromagnetic field, wherein the energy sensing element is electrically coupled to the conductor and disassociated from the coil.

20. The method of claim 19 wherein an output of the sensing module is wirelessly transmitted by a transmitter of the coil, the transmitter receiving operational power from at least one of the conductive sensing element, the more than one energy harvesting elements, and the energy sensing element.

* * * * *

UNITED STATES PATENT AND TRADEMARK OFFICE
CERTIFICATE OF CORRECTION

PATENT NO. : 10,901,005 B2
APPLICATION NO. : 15/178927
DATED : January 26, 2021
INVENTOR(S) : Martin Cook It is certified that error appears in the above-identified patent and that said Letters Patent is hereby corrected as shown below:

In the Specification

Column 2, Line 24: Change "$\mu_c$" to --$\mu_o$--; and

In the Claims

Column 7, Line 5 (Claim 15, Line 2): Delete "said".

Signed and Sealed this
Nineteenth Day of December, 2023

Katherine Kelly Vidal
*Director of the United States Patent and Trademark Office*